United States Patent
Suzuki et al.

(10) Patent No.: US 10,742,210 B2
(45) Date of Patent: Aug. 11, 2020

(54) DRIVE CIRCUIT FOR SWITCH

(71) Applicant: DENSO CORPORATION, Kariya, Aichi-pref. (JP)

(72) Inventors: Tomotaka Suzuki, Kariya (JP); Yusuke Shindo, Kariya (JP); Yasutaka Senda, Kariya (JP); Ken Toshiyuki, Nisshin (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/592,870

(22) Filed: Oct. 4, 2019

(65) Prior Publication Data

US 2020/0112308 A1 Apr. 9, 2020

(30) Foreign Application Priority Data

Oct. 9, 2018 (JP) ................................. 2018-191247

(51) Int. Cl.
*H03K 17/687* (2006.01)

(52) U.S. Cl.
CPC ................................. *H03K 17/687* (2013.01)

(58) Field of Classification Search
CPC .............. H03K 17/567; H03K 17/687; H03K 17/6872; H03K 17/693; H03K 17/04123; H03K 17/04126; H03K 17/063; H03K 17/0822; H03K 17/0828; H03K 17/122; H03K 17/127; H03K 19/00361; H03K 2217/0027; H03K 2217/0036
See application file for complete search history.

(56) References Cited

U.S. PATENT DOCUMENTS

| | | | |
|---|---|---|---|
| 2012/0280728 A1* | 11/2012 | Hussein | H03K 17/127 327/432 |
| 2016/0233858 A1 | 8/2016 | Wasekura et al. | |
| 2016/0301351 A1 | 10/2016 | Kaneda | |
| 2020/0112303 A1 | 4/2020 | Suzuki | |

\* cited by examiner

*Primary Examiner* — Long Nguyen
(74) *Attorney, Agent, or Firm* — Oliff PLC

(57) ABSTRACT

A drive circuit drives switches that are connected to each other in parallel. The drive circuit includes individual discharge paths, a common discharge path, blocking units, a discharge switch, off-holding switches, and a drive control unit. The drive control unit selects, as target switches to be driven to be turned on, at least two switches among the switches. The at least two switches include a first switch and a second switch. The first switch is last to be switched to an off-state among the at least two switches that are selected as the target switches and switched to an on-state. The second switch is other than the first switch among the at least two switches. The off-holding switches includes a first off-holding switch and a second off-holding switch. After switching the second off-holding switch to an on-state, the drive control unit switches the discharge switch to an on-state.

8 Claims, 9 Drawing Sheets

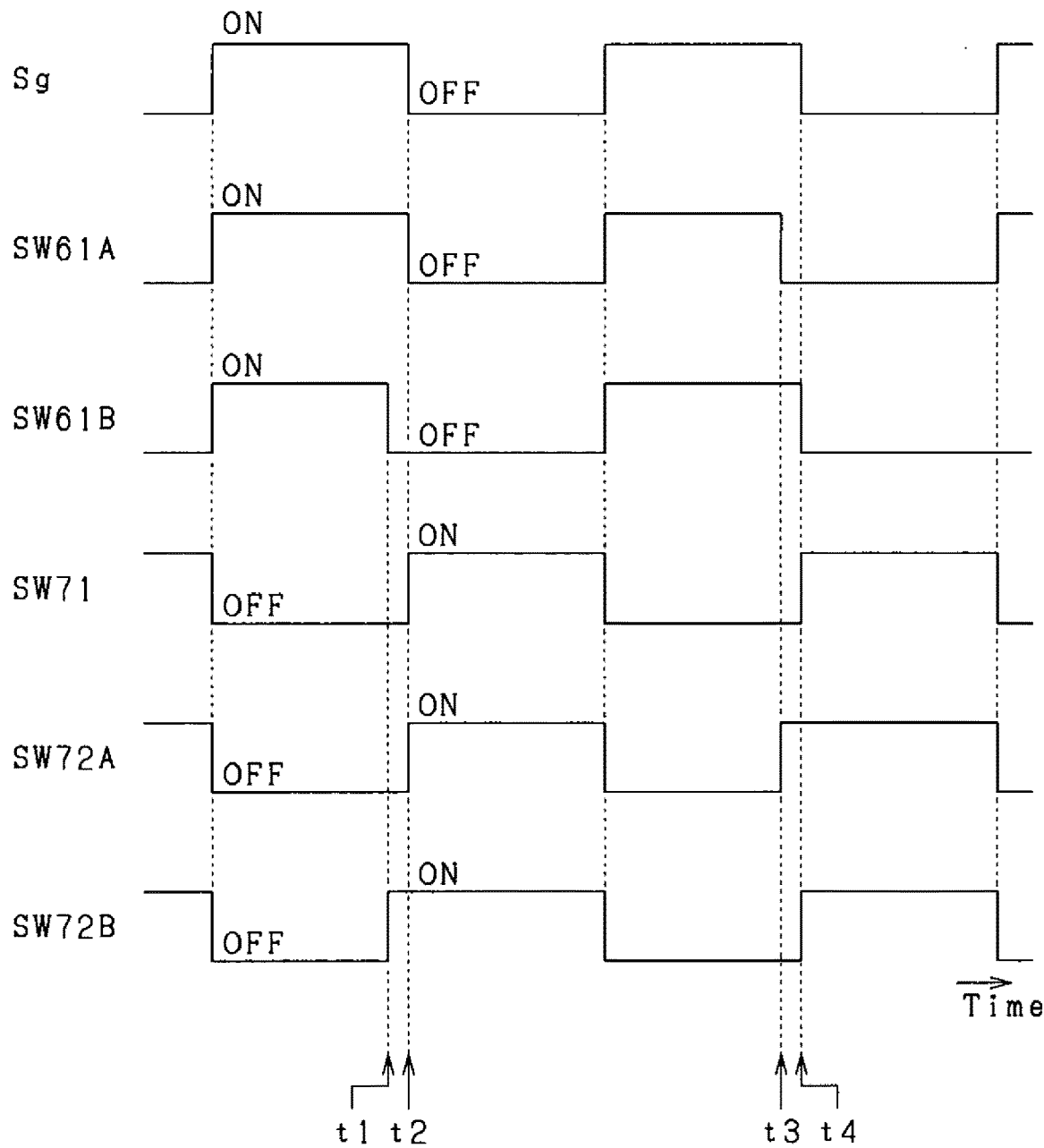

DRIVE CIRCUIT FOR SWITCH

CROSS-REFERENCE TO RELATED APPLICATION

This application is based on and claims the benefit of priority from Japanese Patent Application No. 2018-191247, filed Oct. 9, 2018. The entire disclosure of the above application is incorporated herein by reference.

BACKGROUND

Technical Field

The present disclosure relates to a drive circuit for a switch.

Related Art

A drive circuit that drives first and second switches that are connected to each other in parallel is known. The drive circuit includes a first discharge switch and a second discharge switch, in which the first discharge switch is provided to switch the first switch to an off-state, and the second discharge switch is provided to switch the second switch to the off-state. The drive circuit also includes a first off-holding switch and a second off-holding switch, in which the first off-holding switch short-circuits a gate of the first switch and a grounding portion to which electric charge of the gate is discharged, and the second off-holding switch short-circuits a gate of the second switch and the grounding portion.

SUMMARY

One aspect of the present disclosure provides a drive circuit drives a plurality of switches that are connected to each other in parallel. The drive circuit includes a plurality of individual discharge paths, a common discharge path, a plurality of blocking units, a discharge switch, a plurality of off-holding switches, and a drive control unit. The drive control unit selects, as target switches to be driven to be turned on, at least two switches among the plurality of switches. The at least two switches include a first switch and a second switch. The first switch is last to be switched to an off-state among the at least two switches that are selected as the target switches and switched to an on-state. The second switch is other than the first switch among the at least two switches. The plurality of off-holding switches includes a first off-holding switch and a second off-holding switch. After switching the second off-holding switch to an on-state, the drive control unit switches the discharge switch to an on-state.

BRIEF DESCRIPTION OF THE DRAWINGS

In the accompanying drawings:

FIG. 7 is a diagram of a relationship among power supply voltage, switch temperature, and determination voltage;

FIG. 8 is a timing chart of an operation mode of the drive circuit in the large current region according to a third embodiment;

DESCRIPTION OF THE EMBODIMENTS

Figure 1:
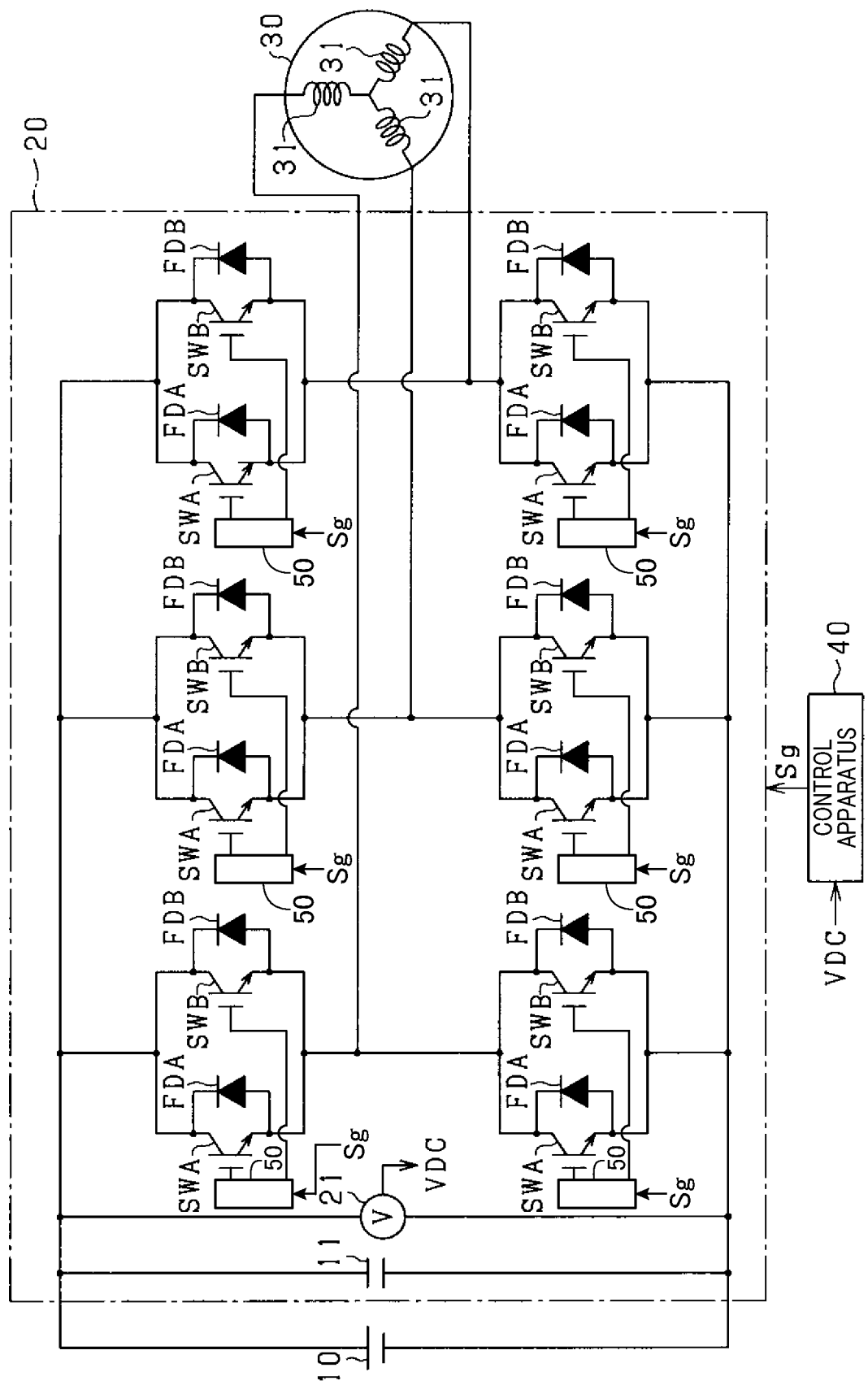
FIG. 1 is an overall configuration diagram of a control system of a rotating electric machine according to a first embodiment.

A drive circuit that drives first and second switches that are connected to each other in parallel is known, as described in JP-A-2016-146717. The drive circuit includes a first discharge switch and a second discharge switch. The first discharge switch is provided to switch the first switch to an off-state. The second discharge switch is provided to switch the second switch to the off-state.

False turn-on, which is a phenomenon in which a switch is erroneously switched to an on-state regardless of an intention to keep the switch in the off-state, may occur. To suppress the occurrence of false turn-on, the drive circuit includes a first off-holding switch and a second off-holding switch. The first off-holding switch short-circuits a gate of the first switch and a grounding portion to which electric charge of the gate is discharged. The second off-holding switch short-circuits a gate of the second switch and the grounding portion. However, in this case, the drive circuit is provided with discharge switches that respectively correspond to the first and second switches, and the off-holding switches that respectively correspond to the first and second switches. Therefore, the number of constituent components of the drive circuit increases.

It is thus desired to provide a drive circuit for a switch in which the number of constituent components can be reduced.

An exemplary embodiment of the present disclosure provides a drive circuit that drives a plurality of switches that are connected to each other in parallel. The drive circuit includes: a plurality of individual discharge paths, a common discharge path, a plurality of blocking units, a discharge switch, a plurality of off-holding switches, and a drive control unit.

Each of the plurality of individual discharge paths is provided to a corresponding one of the plurality of switches and connected to a gate of the corresponding one of the plurality of switches. The common discharge path connects the plurality of individual discharge paths and a grounding portion to which electric charges of the gates of the plurality of switches are discharged. Each of the plurality of blocking units is provided to a corresponding one of the plurality of individual discharge paths, allow a flow of current from the gate side to a first direction toward the common discharge path side, and block a flow of current to a second direction that is opposite the first direction. The discharge switch is provided on the common discharge path. Each of the plurality of off-holding switches is provided to a corresponding of the plurality of switches, and short-circuit the grounding portion and a portion of each of the plurality of individual discharge paths that is closer to the gate side than each of the plurality of blocking units is.

The drive control unit selects, as target switches to be driven to be turned on, at least two switches among the plurality of switches. The at least two switches includes a first switch and a second switch. The first switch is last to be switched to an off-state among the at least two switches that are selected as the target switches and switched to an on-state. The second switch is other than the first switch among the at least two switches. The plurality of off-holding switches includes a first off-holding switch and a second off-holding switch. The first off-holding switch is provided in correspondence to the first switch. The second off-holding switch is provided in correspondence to the second switch. The drive control unit switches the discharge switch to an on-state after switching the second off-holding switch to an on-state.

First, the drive control unit of the present exemplary embodiment switches, to the on-state, the off-holding switch that corresponds to a switch other than the switch that is the last to be switched to an off-state, among the at least two switches that are selected as the target switches and switched to an on-state. At this time, as a result of the blocking unit on the individual discharge path that is connected to the gate of the switch, among the switches, that is not selected as the target switch to be driven to be turned on, a discharge current can be prevented from flowing from the gate of the switch that is not selected as the target switch to the grounding portion. As a result, only the switch that corresponds to the off-holding switch that is switched to the on-state, among the at least two switches that are selected as the target switches and switched to the on-state, can be switched to the off-state.

Subsequently, the drive control unit switches the discharge switch to the on-state. As a result, the remaining switch that is not switched to the off-state, among the at least two switches that are selected as the target switches and switched to the on-state, can be switched to the off-state.

As described above, as a result of the present exemplary embodiment, the at least two switches that are selected as the target switches and switched to the on-state can be switched to the off-state through use of the off-holding switch, in addition to the discharge switch. As a result, each of discharge switches is not required to be provided to a corresponding one of the plurality of switches that are connected to each other in parallel. Consequently, the number of components of the drive circuit can be reduced.

First Embodiment

A first embodiment implementing the drive circuit of the present disclosure will hereinafter be described with reference to the drawings. The drive circuit according to the present embodiment configures a control system of a rotating electric machine.

As shown in FIG. 1, the control system includes a storage battery 10, an inverter 20, a rotating electric machine 30, and a control apparatus 40. The storage battery 10 serves as a direct-current power supply. The inverter 20 serves as a power converter. The rotating electric machine 30 is connected to the storage battery 10 with the inverter 20 therebetween. Here, a smoothing capacitor 11 is provided between the storage battery 10 and the inverter 20. In addition, for example, a permanent magnet field-type synchronous motor may be used as the rotating electric machine 30.

The inverter 20 includes upper arm switches and lower arm switches for three phases. The upper arm switch and the lower arm switch are each configured by a first switch SWA and a second switch SWB that are connected in parallel. A first end of the smoothing capacitor 11 is connected to high-potential-side terminals of the first and second switches SWA and SWB of the upper arm of each phase. High-potential-side terminals of the first and second switches SWA and SWB of the lower arm of each phase are respectively connected to low-potential-side terminals of the first and second switches SWA and SWB of the upper arm of each phase. A second end of the smoothing capacitor 11 is connected to the low-potential-side terminals of the first and second switches SWA and SWB of the lower arm of each phase. For each phase, a first end of a winding 31 of the rotating electric machine 30 is connected to a connection point between the low-potential-side terminals of the first and second switches SWA and SWB of the upper arm and the high-potential-side terminals of the first and second switches SWA and SWB of the lower arm. A second end of the winding 31 of each phase is connected to a neutral point.

According to the present embodiment, a voltage-control-type semiconductor switching element is used as each of the first and second switches SWA and SWB. More specifically, a silicon insulated-gate bipolar transistor (IGBT) is used. Therefore, in the first and second switches SWA and SWB, the high-potential-side terminal is a collector and the low-potential-side terminal is an emitter. First and second free-wheeling diodes FDA and FDB are respectively connected in antiparallel to the first and second switches SWA and SWB.

The control system includes a voltage detecting unit 21 that detects a terminal voltage of the smoothing capacitor 11 as a power supply voltage VDC. The power supply voltage VDC that is detected by the voltage detecting unit 21 is inputted to the control apparatus 40.

The control apparatus 40 sets the first and second switches SWA and SWB of the upper arm and the first and second switches SWA and SWB of the lower arm of each phase to the on-state in an alternating manner, so as to control a controlled variable of the rotating electric machine 30 to a command value thereof. For example, the controlled variable is torque. The control apparatus 40 outputs an on-command or an off-command as a drive signal Sg of the first and second switches SWA and SWB to a drive circuit 50. The on-command instructs that setting to the on-state be performed. The off-command instructs that setting to the off-state be performed. The drive circuit 50 is individually provided for each set of first and second switches SWA and SWB of each arm of each phase.

Figure 2:
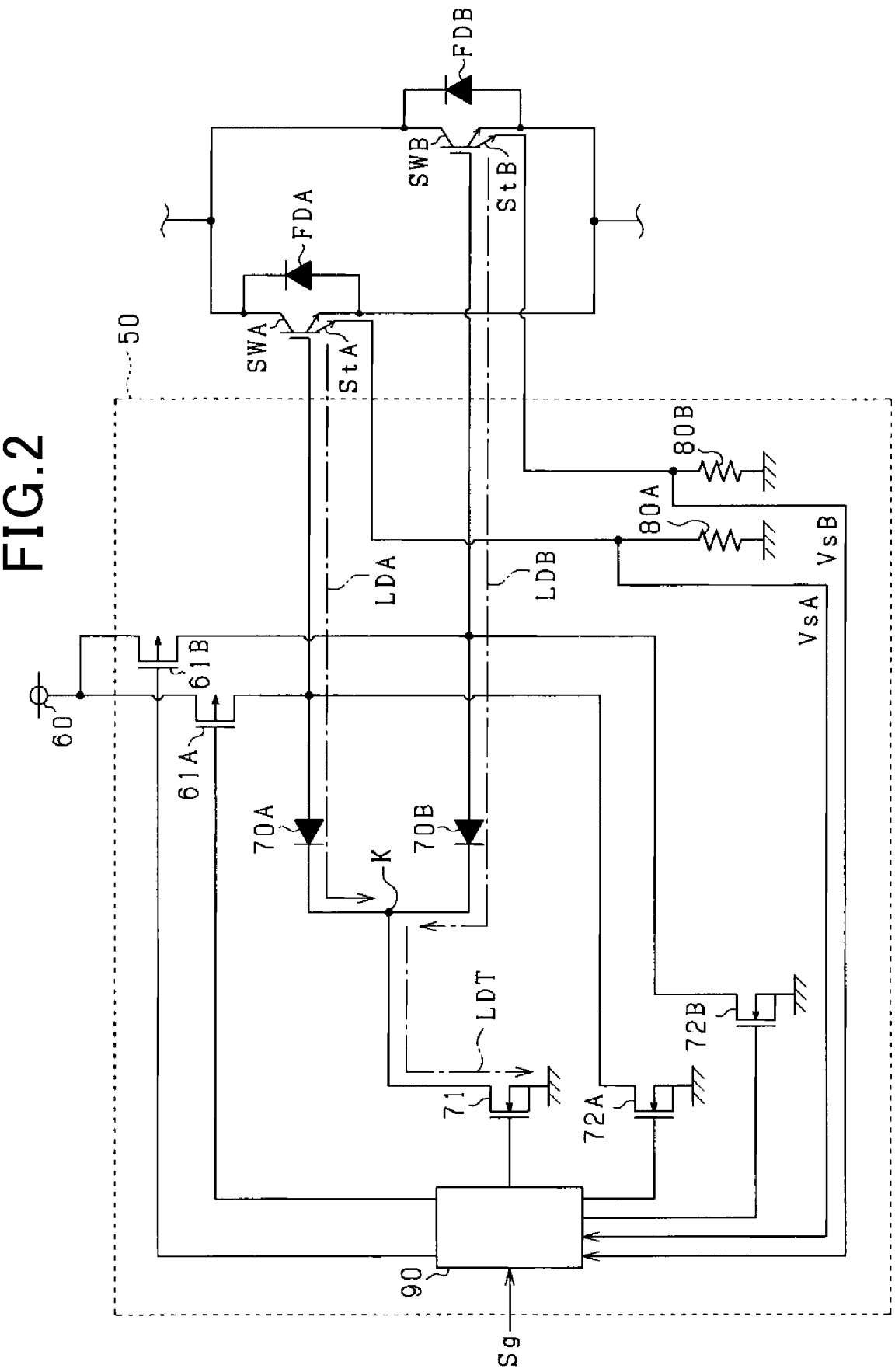
FIG. 2 is a diagram of a drive circuit for a switch.

As shown in FIG. 2, the drive circuit 50 that includes the inverter 20 acquires the drive signal Sg from the control apparatus 40. The drive circuit 50 then sets the first and second switches SWA and SWB to the on-state or the off-state based on the acquired drive signal Sg. The drive circuit 50 includes a first charging switch 61A and a first diode 70A. According to the present embodiment, the first charging switch 61A is a P-channel metal-oxide-semiconductor field-effect transistor (MOSFET). A power supply 60 is connected to a source of the first charging switch 61A. A gate of the first switch SWA is connected to a drain of the first charging switch 61A. An anode of the first diode 70A is connected to the gate of the first switch SWA.

The drive circuit 50 includes a second charging switch 61B and a second diode 70B. According to the present embodiment, the second charging switch 61B is a P-channel MOSFET. The power supply 60 is connected to a source of the second charging switch 61B. A gate of the second switch SWB is connected to a drain of the second charging switch 61B. An anode of the second diode 70B is connected to the gate of the second switch SWB. A connection point K is connected to respective cathodes of the second diode 70B and the first diode 70A.

The drive circuit 50 includes a discharge switch 71. According to the present embodiment, the discharge switch 71 is an N-channel MOSFET. The connection point K is connected to a drain of the discharge switch 71. Respective emitters of the first and second switches SWA and SWB are connected to a source of the discharge switch 71 as a grounding portion.

Here, according to the present embodiment, an electrical path from the gate of the first switch SWA to the connection point K via the first diode 70A corresponds to a first individual discharge path LDA corresponding to the first switch SWA. In addition, an electrical path from the gate of the second switch SWB to the connection point K via the second diode 70B corresponds to a second individual discharge path LDB corresponding to the second switch SWB. Furthermore, an electrical path from the connection point K to the emitter via the discharge switch 71 corresponds to a common discharge path LDT. Moreover, according to the present embodiment, the first and second diodes 70A and 70B correspond to a blocking unit.

The drive circuit 50 includes a first off-holding switch 72A and a second off-holding switch 72B. According to the present embodiment, the first off-holding switch 72A and the second off-holding switch 72B are N-channel MOSFETs. A portion of the first individual discharge path LDA, which is closer to the gate side than the anode of the first diode 70A is, is connected to a drain of the first off-holding switch 72A. The emitter of the first switch SWA is connected to a source of the first off-holding switch 72A. A portion of the second individual discharge path LDB, which is closer to the gate side than the anode of the second diode 70B is, is connected to a drain of the second off-holding switch 72B. The emitter of the second switch SWB is connected to a source of the second off-holding switch 72B.

The first switch SWA includes a first sense terminal StA to which a minute current flows. The minute current is correlated with a collector current that flows to the first switch SWA itself. A first end of a first sense resistor 80A is connected to the first sense terminal StA. The emitter of the first switch SWA is connected to a second end of the first sense resistor 80A. An amount of voltage drop is generated in the first sense resistor 80A as a result of the minute current that flows to the first sense terminal StA. Therefore, a first sense voltage VsA that is a potential on the first sense terminal StA side of the first sense resistor 80A is an electrical state quantity that is correlated with the collector current. According to the present embodiment, with an emitter potential of the first switch SWA as 0, a sign of the first sense voltage VsA that is higher than the emitter potential is defined as being positive. The first sense voltage VsA is inputted to a drive control unit 90 that is provided in the drive circuit 50.

The second switch SWB includes a second sense terminal StB to which a minute current flows. The minute current is correlated with a collector current that flows to the second switch SWB itself. A first end of a second sense resistor 80B is connected to the second sense terminal StB. The emitter of the second switch SWB is connected to a second end of the second sense resistor 80B. As a result of this configuration, a second sense voltage VsB that is a potential on the second sense terminal StB side of the second sense resistor 80B is an electrical state quantity that is correlated with the collector current. According to the present embodiment, with an emitter potential of the second switch SWB as 0, a sign of the second sense voltage VsB that is higher than the emitter potential is defined as being positive. The second sense voltage VsB is inputted to the drive control unit 90.

The drive control unit 90 provides a function for detecting respective gate voltages of the first switch SWA and the second switch SWB.

The drive control unit 90 acquires the drive signal Sg that is generated by the control apparatus 40. The drive control unit 90 drives the first and second switches SWA and SWB based on the acquired drive signal Sg, the first sense voltage VsA, and the second sense voltage VsB. When a total sense voltage Vse is determined to be equal to or less than a determination voltage Vα (corresponding to a determination value), the drive control unit 90 determines that a total value of the collector currents flowing to the first and second switches SWA and SWB is included in a small current region (corresponding to a second current region). The total sense voltage Vse is an addition value of the first sense voltage VsA and the second sense voltage VsB. The drive control unit 90 then switches the first switch SWA to the on-state or the off-state based on the drive signal Sg and keeps the second switch SWB in the off-state.

Meanwhile, when the total sense voltage Vse is determined to exceed the determination voltage Vα, the drive control unit 90 determines that the total value of the collector currents flowing to the first and second switches SWA and SWB is included in a large current region (corresponding to a first current region). The drive control unit 90 then synchronously switches both the first and second switches SWA and SWB to the on-state or the off-state based on the drive signal Sg.

Here, for example, the total sense voltage Vse that is used to determine the current region in which the above-described total value is included may be the total sense voltage Vse that has been detected during a previous period in which the drive signal Sg is the on-command. In this case, a switch, of the first and second switches SWA and SWB, that is to be driven so as to be turned on during a next period in which the drive signal Sg is the on-command is selected based on the total sense voltage Vse that has been detected during the previous period in which the drive signal Sg is the on-command.

Figure 3:
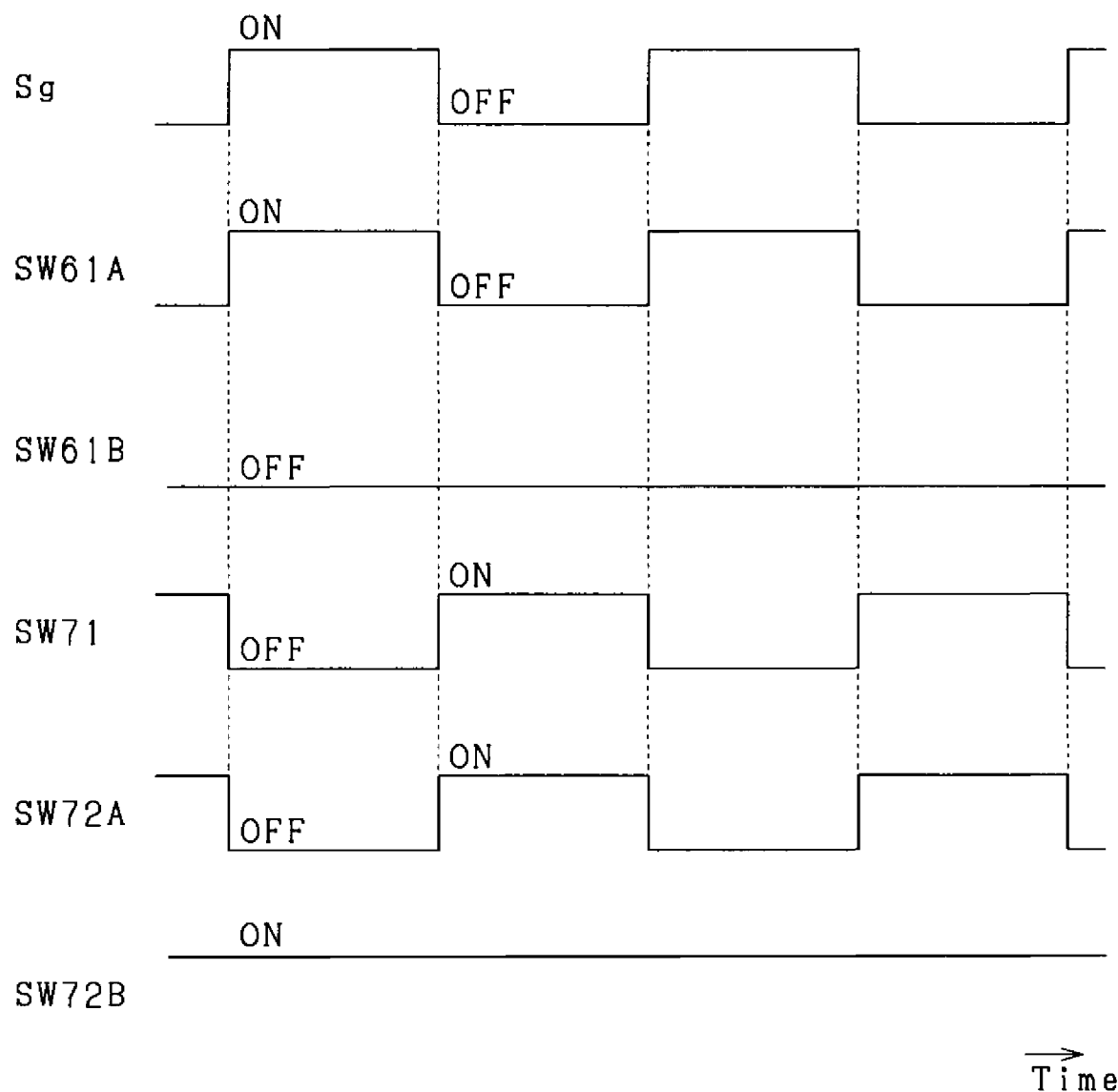
FIG. 3 is a timing chart of an operation mode of the drive circuit in a small current region.

An operation of the drive circuit 50 in the small current region in which the total sense voltage Vse is determined to be equal to or less than the determination voltage Vα will be described with reference to FIG. 3. FIG. 3 shows transitions in the driving states of: (i) the drive signal Sg that is inputted to the drive control unit 90 (i.e., Sg); (ii) the first and second charging switches 61A and 61B (i.e., SW61A and SW61B); (iii) the discharge switch 71 (i.e., SW71); and (iv) the first and second off-holding switches 72A and 72B (i.e., SW72A and SW72B). According to the present embodiment, a period from when the drive signal Sg is switched to the on-command until the drive signal Sg is subsequently switched to the on-command, shown in FIG. 3, is a single switching cycle.

In the small current region, the drive control unit 90 keeps the second charging switch 61B in the off-state and the second off-holding switch 72B in the on-state. As a result, the gate voltage of the second switch SWB becomes less than a threshold voltage Vth. The second switch SWB is kept in the off-state.

When the drive signal Sg is determined to be the on-command, the drive control unit 90 sets the first charging switch 61A to the on-state, and the discharge switch 71 and the first off-holding switch 72A to the off-state. As a result, the gate voltage of the first switch SWA becomes equal to or greater than the threshold voltage Vth. Thus, the first switch SWA is switched to the on-state.

Meanwhile, when the drive signal Sg is determined to be the off-command, the drive control unit 90 sets the first charging switch 61A to the off-state and the discharge switch 71 to the on-state. As a result, the gate voltage of the first switch SWA becomes less than the threshold voltage Vth. Thus, the first switch SWA is switched to the off-state. In addition, when the drive signal Sg is determined to be the off-command and the gate voltage of the first switch SWA is determined to be equal to or less than the threshold voltage Vth, the drive control unit 90 switches the first off-holding switch 72A to the on-state. Here, conditions for switching the first off-holding switch 72A to the on-state include a condition related to the gate voltage. Therefore, in actuality, the first off-holding switch 72A is switched to the on-state after the discharge switch 71 is switched to the on-state. However, in FIG. 3, a timing at which the discharge switch 71 is switched to the on-state and a timing at which the first off-holding switch 72A is switched to the on-state are shown to be a same timing, for convenience.

In the small current region, as a result of only the first charging switch 61A of the first and second charging switches 61A and 61B being switched to the on-state, the gate of only the first switch SWA of the first and second switches SWA and SWB is supplied a charging current from the power supply 60. At this time, as a result of the second diode 70B being provided on the second individual discharge path LDB, the charging current being supplied to the gate of the second switch SWB from the power supply 60 can be prevented. Therefore, only the first switch SWA can be switched to the on-state.

Figure 4:
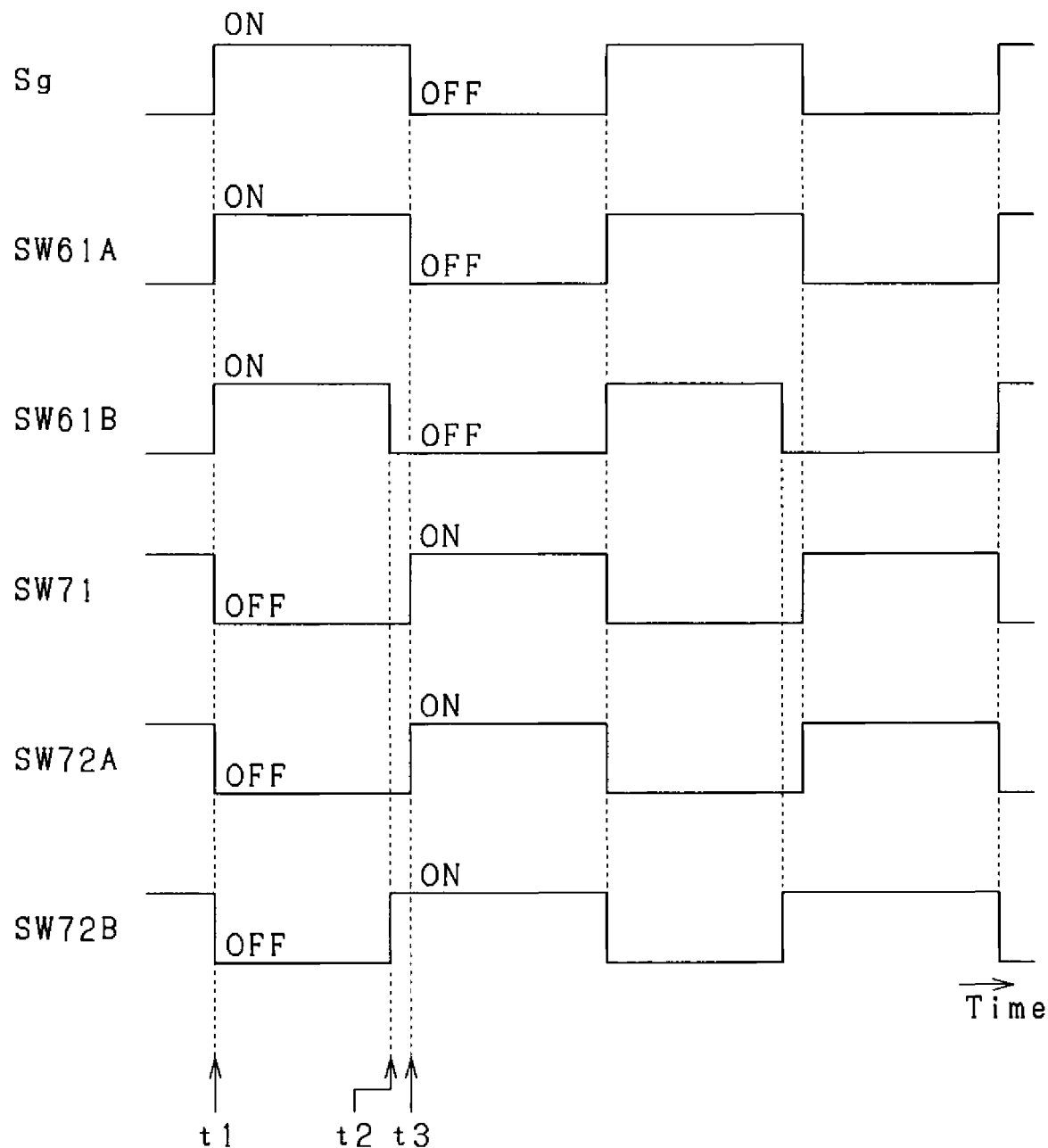
FIG. 4 is a timing chart of an operation mode of the drive circuit in a large current region.

An operation of the drive circuit 50 in the large current region in which the total sense voltage Vse is determined to exceed the determination voltage Vα will be described with reference to FIG. 4. In FIG. 4, Sg, SW61A, SW61B, SW71, SW72A, and SW72B correspond to those of FIG. 3, described above.

At time t1, the drive control unit 90 determines that the drive signal Sg is switched to the on-command. The drive control unit 90 switches the first and second charging switches 61A and 61B to the on-state, and the discharge switch 71 and the first and second off-holding switches 72A and 72B to the off-state. As a result, the first and second switches SWA and SWB are switched to the on-state.

Subsequently, at time t2 before time t3 at which the drive signal Sg is switched to the off-command, the drive control unit 90 switches the second charging switch 61B to the off-state and the second off-holding switch 72B to the on-state. In this case, a discharge current can be prevented from flowing from the gate of the first switch SWA by the first diode 70A on the first individual discharge path LDA. Therefore, the second switch SWB can be switched to the off-state while the first switch SWA is kept in the on-state.

Here, the first switch SWA remains in the on-state when the second switch SWB is switched to the off-state. Therefore, a surge voltage is not generated when the second switch SWB is switched to the off-state.

Subsequently, at time t3, the drive control unit 90 determines that the drive signal Sg is switched to the on-command. The drive control unit 90 switches the first charging switch 61A to the off-state and the discharge switch 71 to the on-state. As a result, the discharge current flows from the gate of the first switch SWA and the first switch SWA is switched to the off-state. In addition, when the drive signal Sg is determined to be the off-command and the gate voltage of the first switch SWA is determined to be equal to or less than the threshold voltage Vth, the drive control unit 90 switches the first off-holding switch 72A to the on-state.

Here, in FIG. 4, a timing at which the discharge switch 71 is switched to the on-state and a timing at which the first off-holding switch 72A is switched to the on-state are shown to be a same timing, for convenience.

As described above, according to the present embodiment, in the large current region, the first and second switches SWA and SWB can be switched to the off-state through use of the second off-holding switch 72B, in addition to the discharge switch 71. Therefore, a discharge switch is not required to be individually provided for each of the first and second switches SWA and SWB. As a result, the number of components of the drive circuit 50 can be reduced.

Variation Example According to the First Embodiment

Figure 5:
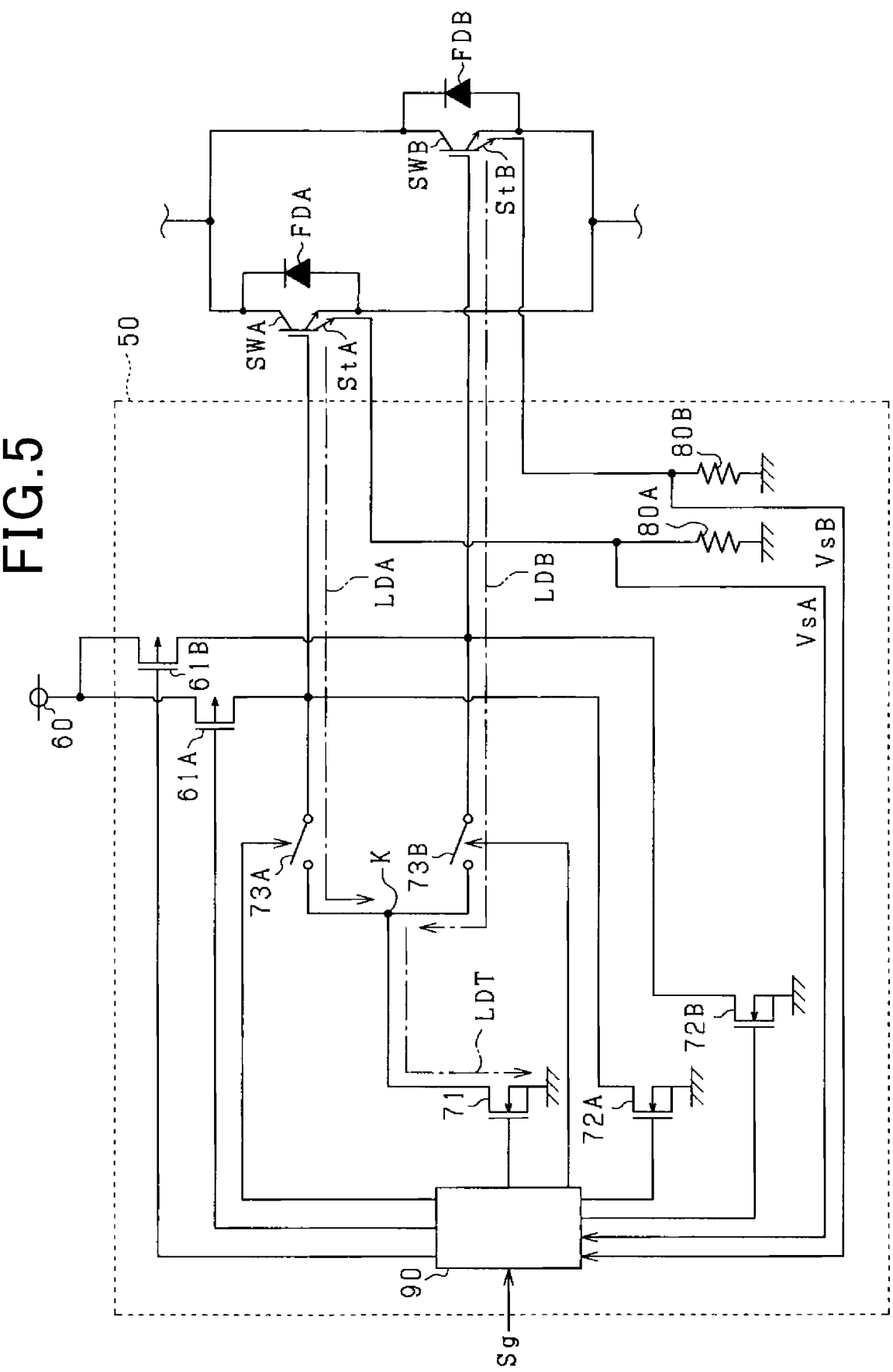
FIG. 5 is a diagram of the drive circuit for a switch in a variation example according to the first embodiment.

As shown in FIG. 5, the drive circuit 50 includes a first discharge blocking switch 73A instead of the first diode 70A and a second discharge blocking switch 73B instead of the second diode 70B. The first discharge blocking switch 73A and the second discharge blocking switch 73B correspond to the blocking unit. When the drive signal Sg is determined to be the on-command, the drive control unit 90 sets the first and second discharge blocking switches 73A and 73B to the off-state. When the drive signal Sg is determined to be the off-command, the drive control unit 90 sets the first and second discharge blocking switches 73A and 73B to the on-state. In FIG. 5, configurations that are identical to the configurations shown in FIG. 2, described above, are given the same reference numbers for convenience.

Second Embodiment

Figure 6:
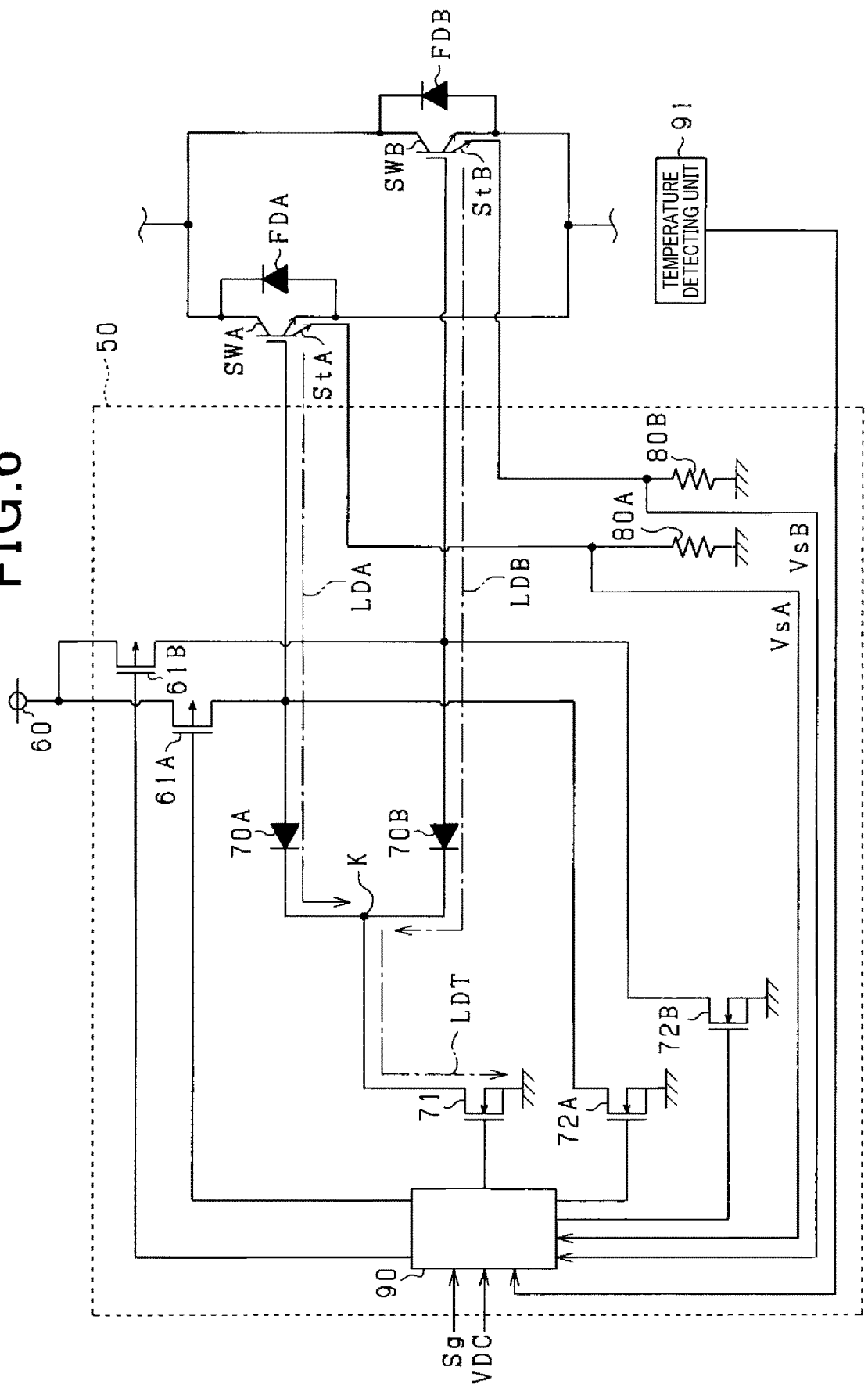
FIG. 6 is a diagram of the drive circuit for a switch according to a second embodiment.

A second embodiment will be described below with reference to the drawings, mainly focusing on differences with the first embodiment. According to the present embodiment, the control system includes a temperature detecting unit 91. The temperature detecting unit 91 outputs a temperature signal based on temperatures of the first and second switches SWA and SWB. For example, the temperature detecting unit 91 is configured by a temperature-sensitive diode. The temperature signal is inputted to the drive control unit 90. The drive control unit 90 calculates a switch temperature TD that is a temperature of each of the first and second switches SWA and SWB based on the temperature signal. In FIG. 6, configurations that are identical to the configurations in FIG. 2, described above, are given the same reference numbers for convenience.

The power supply voltage VDC from the control apparatus 40 is inputted to the drive control unit 90. According to the present embodiment, the power supply voltage VDC and the switch temperature TD correspond to setting parameters. As shown in FIG. 7, the drive control unit 90 sets the determination voltage Vα to be greater when the power supply voltage VDC is lower than a predetermined threshold, compared to when the power supply voltage VDC is higher than the threshold. Switching loss decreases as the terminal voltage of the smoothing capacitor 11 decreases. Temperature increase in the switch is suppressed. Therefore, it is thought that reliability of the first switch SWA does not decrease, even if an upper limit value of a range of the total sense voltage Vse in which only the first switch SWA of the first and second switches SWA and SWB is to be driven to be turned on is increased as the terminal voltage of the smoothing capacitor 11 decreases.

In addition, the drive control unit 90 sets the determination voltage Vα to be greater when the switch temperature TD is lower than a predetermined threshold, compared to when the switch temperature TD is higher than the threshold. Conduction loss in the switch decreases as the temperature of the switch decreases. Temperature increase in the switch is suppressed. Therefore, it is thought that reliability of the first switch SWA does not decrease, even if the upper limit value of the range of the total sense voltage Vse in which only the first switch SWA of the first and second switches SWA and SWB is to be driven turned on is increased as the temperature of the switch decreases.

When only the first switch SWA of the first and second switches SWA and SWB is to be driven to be turned on, operation of configurations used for driving the second switch SWB, such as the second charging switch 62B, can be stopped. Therefore, according to the present embodiment, loss that is generated in the drive circuit 50 on can be reduced as a result of increase in opportunities in which one switch is to be driven to be turned, while decrease in the reliability of the first switch SWA is suppressed.

Third Embodiment

A third embodiment will be described below with reference to the drawings, mainly focusing on differences with the first embodiment. According to the present embodiment, as shown in FIG. 8, the drive control unit 90 alternately sets the first off-holding switch 72A and the second off-holding switch 72B to the on-state at every switching cycle. That is, at every switching cycle, the drive control unit 90 successively switches the switch, of the first and second switches SWA and SWB, that is to be switched to the off-state by the discharge switch 71 being switched to the on-state. In FIG. 8, Sg, SW61A, SW61B, SW71, SW72A, and SW72B correspond to those of FIG. 4, described above.

At time t1 before time t2 at which the drive signal Sg is switched to the off-command, the drive control unit 90 switches the second charging switch 61B to the off-state and the second off-holding switch 72B to the on-state. As a result, the second switch SWB is switched to the off-state while the first switch SWA is kept in the on-state. Subsequently, at time t2, the drive control unit 90 determines that the drive signal Sg is switched to the off-command. The drive control unit 90 switches the first charging switch 61A to the off-state and the discharge switch 71 to the on-state. As a result, the first switch SWA is switched to the off-state. In addition, when the drive signal Sg is determined to be the off-command and the gate voltage of the first switch SWA is determined to be equal to or less than the threshold voltage Vth, the drive control unit 90 switches the first off-holding switch 72A to the on-state.

Subsequently, at time t3 that is a next switching cycle, the drive control unit 90 switches the first charging switch 61A to the off-state and the first off-holding switch 72A to the on-state. As a result, the first switch SWA is switched to the off-state while the second switch SWB is kept in the on-state.

Then, at time t4, the drive control unit 90 determines that the drive signal Sg is switched to the off-command. The drive control unit 90 switches the second charging switch 61B to the off-state and the discharge switch 71 to the on-state. As a result, the second switch SWB is switched to the off-state. In addition, when the drive signal Sg is determined to be the off-command and the gate voltage of the second switch SWB is determined to be equal to or less than the threshold voltage Vth, the drive control unit 90 switches the second off-holding switch 72B to the on-state.

According to the present embodiment described above, the first off-holding switch 72A and the second off-holding switch 72B are alternately switched to the on-state at every switching cycle. As a result, heat generation can be prevented from being concentrated in either of the first and second off-holding switches 72A and 72B. Decrease in the reliability of the first and second off-holding switches 72A and 72B can be suppressed.

Variation Example According to the Third Embodiment

The configuration shown in FIG. 8 can also be applied to cases in which the number of switches that configure the inverter 20 and are connected to each other in parallel is three or more. For example, the switches that configure the inverter 20 are first to third switches. The off-holding switches corresponding to the first to third switches are first to third off-holding switches. In this case, for example, the configuration may be such that switching cycles (A) to (C), described below, are performed in the following sequence: (A), (B), (C), (A), (B), (C), . . . .

(A) is a switching cycle in which the discharge switch 71 is switched to the on-state after the second and third off-holding switches are switched to the on-state.

(B) is a switching cycle in which the discharge switch 71 is switched to the on-state after the first and third off-holding switches are switched to the on-state.

(C) is a switching cycle in which the discharge switch 71 is switched to the on-state after the first and second off-holding switches are switched to the on-state.

In the case of (A), the switch that is switched to the off-state as a result of the discharge switch 71 being switched to the on-state is the first switch. In the case of (B), the switch that is switched to the off-state as a result of the discharge switch 71 being switched to the on-state is the second switch. In the case of (C), the switch that is switched to the off-state as a result of the discharge switch 71 being switched to the on-state is the third switch. In this manner, the switch that is switched to the off-state as a result of the discharge switch 71 being switched to the on-state is successively switched at every switching cycle.

Fourth Embodiment

Figure 9:
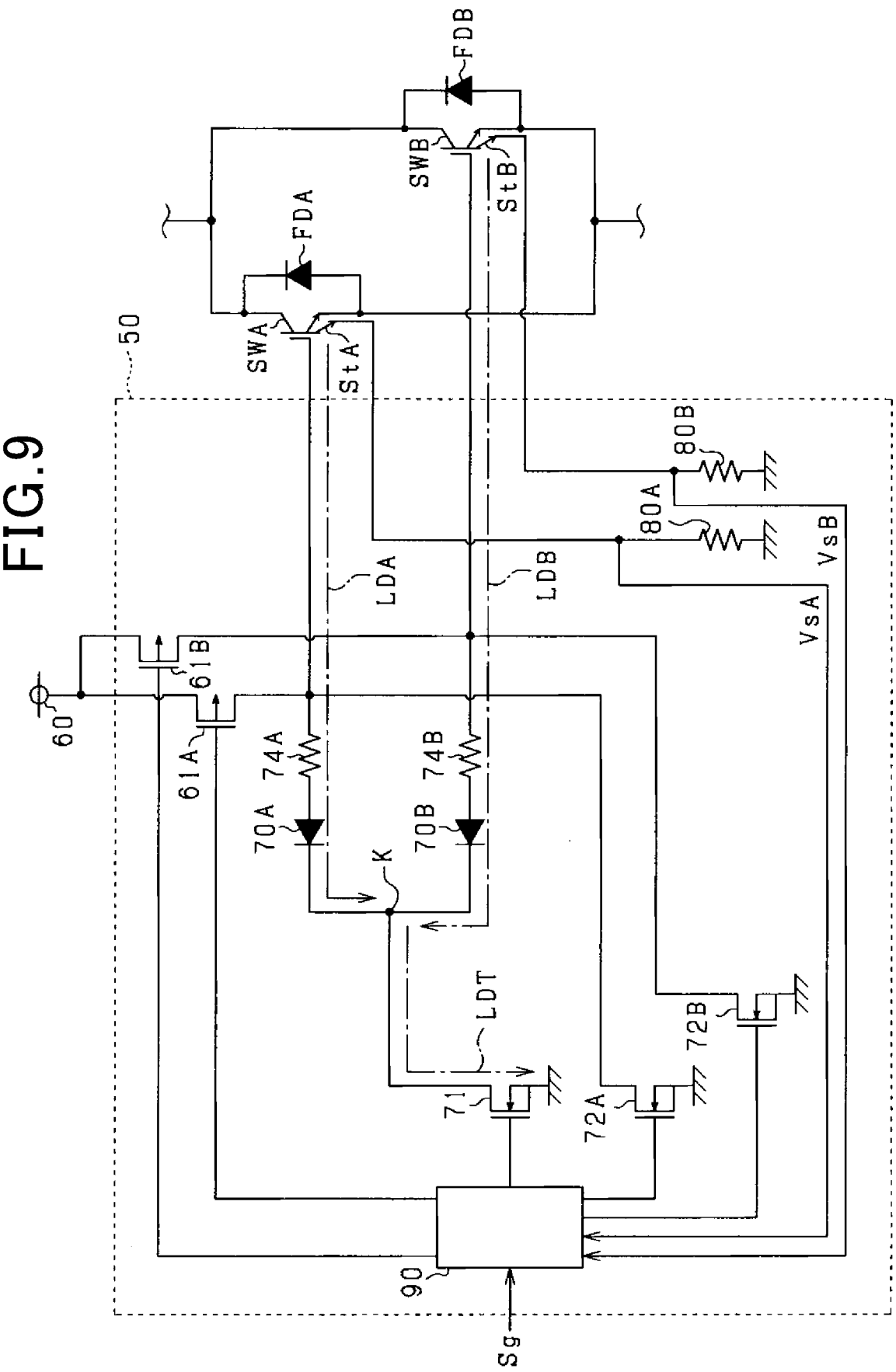
FIG. 9 is a diagram of the drive circuit for a switch according to a fourth embodiment.

A fourth embodiment will be described below with reference to the drawings, mainly focusing on differences with the first embodiment. According to the present embodiment, as shown in FIG. 9, the drive circuit 50 includes a first resistor 74A and a second resistor 74B. In FIG. 9, configurations that are identical to the configurations in FIG. 2, described above, are given the same reference numbers for convenience.

The first resistor 74A is provided between the first diode 70A and the gate of the first switch SWA on the first individual discharge path LDA. The second resistor 74B is provided between the second diode 70B and the gate of the second switch SWB on the second individual discharge path LDB. The first and second resistors 74A and 74B are provided to adjust a switching speed of the first and second switches SWA and SWB.

According to the present embodiment, the resistors 74A and 74B are provided on the individual discharge paths LDA and LDB. However, a resistor for adjusting the switching speed is not provided between the connection point K and the discharge switch 71 on the common discharge path LDT.

As a result of the configuration described above, the switching speed when the switch is switched to the off-state can be made equal between cases in which only the first switch SWA of the first and second switches SWA and SWB is selected as the target switch to be driven, and cases in which both the first and second switches SWA and SWB are selected as the target switches to be driven. Specifically, the switching speed when only the first switch SWA is switched to the off-state and the switching speed when both the first and second switches SWA and SWB are switched to the off-state can be made equal. A reason for this is that a time constant that is prescribed based on a capacity (C) of the first switch SWA and a resistance value (R) of the first resistor 74A, and a time constant that is prescribed based on a capacity (C) of the second switch SWB and a resistance value (R) of the second resistor 74B can be made equal. According to the present embodiment described above, the switching speed when the switch is switched to the off-state can be prevented from becoming too high. Failure of the switch can be prevented.

Variation Example According to the Fourth Embodiment

Figure 10:
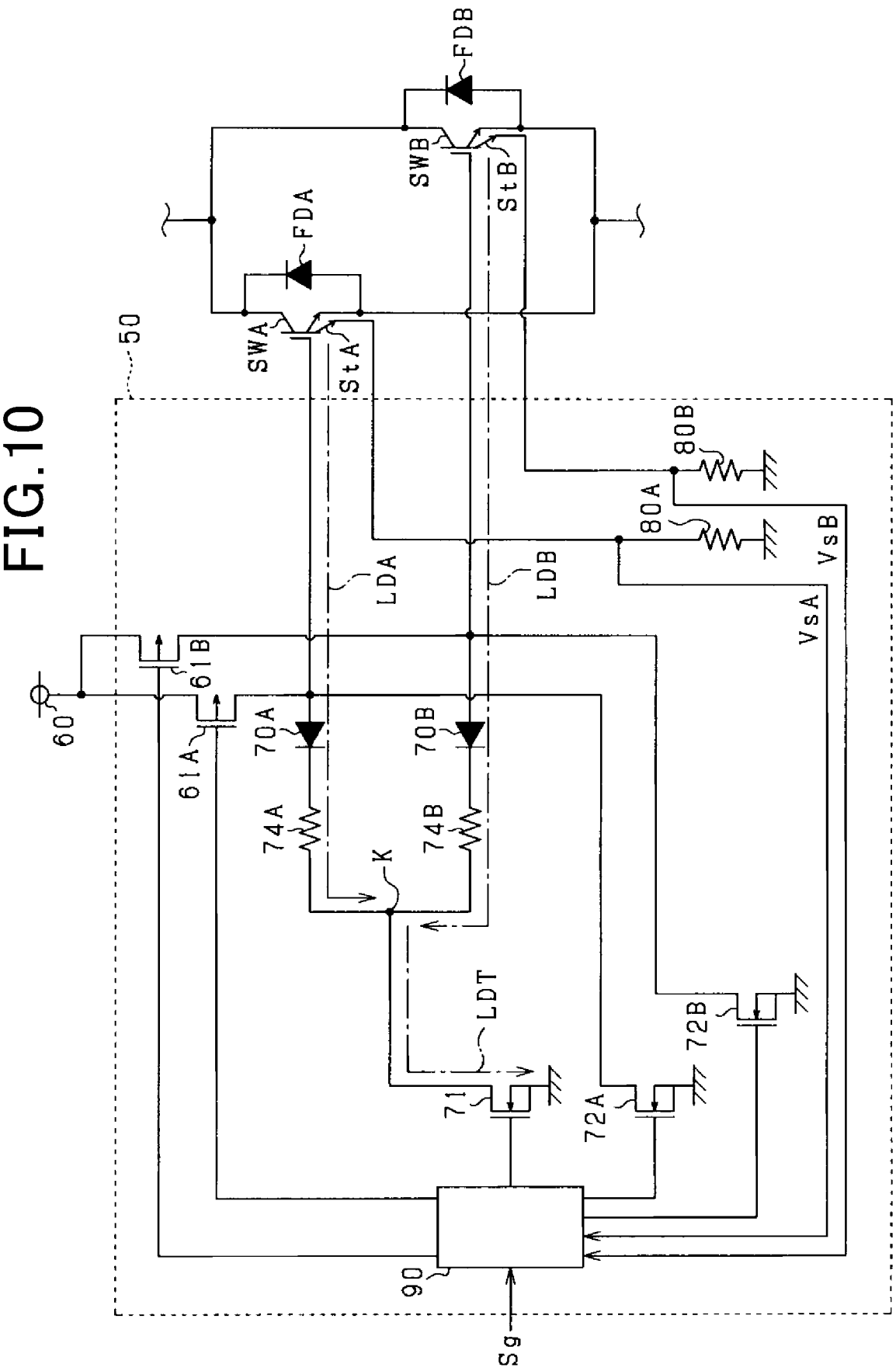
FIG. 10 is a diagram of the drive circuit for a switch in a variation example according to the fourth embodiment.

As shown in FIG. 10, the first resistor 74A may be provided between the first diode 70A and the connection point K on the first individual discharge path LDA. In addition, the second resistor 74B may be provided between the second diode 70B and the connection point K on the second individual discharge path LDB.

OTHER EMBODIMENTS

Here, the above-described embodiments may be modified in the following manner.

According to the second embodiment, the determination voltage Vα may be set based on only the power supply voltage VDC of the power supply voltage VDC and the switch temperature TD. Alternatively, the determination voltage Vα may be set based on only the switch temperature TD of the power supply voltage VDC and the switch temperature TD.

The number of switches that are connected to each other in parallel is not limited to two and may be three or more. In this case as well, all that is required is that the number of switches to be selected as target switches to be driven to be turned on be greater in the large current region, compared to the number of switches to be selected as target switches to be driven to be turned on in the small current region.

In addition, when the number of switches that are connected to one another in parallel is three or more, the current region may be divided into three or more current regions. Specifically, for example, the current region may be divided into a small current region, an intermediate current region in which the current is greater than that in the small current region, and a large current region in which the current is greater than that in the intermediate current region. In this case, the greater of adjacent current regions corresponds to the first current region and the smaller corresponds to the second current region.

Furthermore, when the number of switches that are connected to one another in parallel is three or more, regarding switches among these switches excluding a switch that is the last to be switched to the off-state, the timing at which the corresponding off-holding switch is switched to the on-state may be the same or may differ.

The grounding portion to which the source of the discharge switch 71 and the sources of the off-holding switches 72A and 72B are connected is not limited to the emitters of the first and second switches SWA and SWB. For example, the grounding portion may be a negative voltage source of which the voltage is lower than the emitter potential.

The switches that configure the inverter 20 are not limited to the IGBTs. For example, the switches may be silicon carbide N-channel MOSFETs. In addition, a parallel-connection body of a plurality of switches that configure each arm of each phase of the inverter 20 is not limited to a parallel-connection body that is composed of switches of the same type, and may be a parallel-connection body that is composed of switches of differing types. For example, the parallel-connection body of a plurality of switches that configure each arm of each phase may be a parallel-connection body that is composed of two IGBTs and a single MOSFET.

The power converter that includes the switches is not limited to the inverter. For example, the power converter may be a direct current-to-direct current (DCDC) converter that provides at least either of a function for boosting an input voltage and outputting the boosted input voltage, and a function for reducing the input voltage and outputting the reduced input voltage.

What is claimed is:

1. A drive circuit that drives a plurality of switches that are connected to each other in parallel, the drive circuit comprising:
   a plurality of individual discharge paths each of which is provided to a corresponding one of the plurality of switches, and connected to a gate of the corresponding one of the plurality of switches;
   a common discharge path that connects the plurality of individual discharge paths and a grounding portion to which electric charges of the gates of the plurality of switches are discharged;
   a plurality of blocking units each of which is provided to a corresponding one of the plurality of individual discharge paths, allow a flow of current from the gate side to a first direction toward the common discharge path side, and block a flow of current to a second direction that is opposite the first direction;
   a discharge switch that is provided on the common discharge path;
   a plurality of off-holding switches each of which is provided to a corresponding one of the plurality of switches, and short-circuit the grounding portion and a portion of each of the plurality of individual discharge paths that is closer to the gate side than each of the plurality of blocking units is; and
   a drive control unit that selects, as target switches to be driven to be turned on, at least two switches among the plurality of switches, the at least two switches comprising a first switch and a second switch, the first switch being last to be switched to an off-state among the at least two switches that are selected as the target switches and switched to an on-state, and the second switch is other than the first switch among the at least two switches, the plurality of off-holding switches comprising a first off-holding switch and a second off-holding switch, the first off-holding switch being provided in correspondence to the first switch, the second off-holding switch being provided in correspondence to the second switch, wherein the drive control unit switches the discharge switch to an on-state after switching the second off-holding switch to an on-state.

2. The drive circuit according to claim 1, further comprising:
a plurality of resistors each of which is provided to a corresponding one of the individual discharge paths, wherein
a resistor is not provided between the discharge switch and a connection point with each of the individual discharge paths on the common discharge path.

3. The drive circuit according to claim 1, wherein:
the drive control unit successively switches a switch that is switched to the off-state as a result of the discharge switch being switched to the on-state, among the at least two switches that are selected as the target switches and switched to the on-state, at every switching cycle.

4. The drive circuit according to claim 2, wherein:
the drive control unit successively switches a switch that is switched to the off-state as a result of the discharge switch being switched to the on-state, among the at least two switches that are selected as the target switches and switched to the on-state, at every switching cycle.

5. The drive circuit according to claim 1, wherein:
the drive control unit
selects, as target switches to be driven to be turned on, at least two switches among the switches in a first current region, and
selects, as the target switches to be driven to be turned on, a fewer number of switches than the number of switches that are selected as the target switches to be driven to be turned on in the first current region, in a second current region that is a current region in which a current is smaller than that in the first current region; and
the drive control unit
determines that a present current region is the second current region when determined that a total value of currents that flow to a parallel-connection body of the switches is equal to or less than a predetermined determination value,
determines that the present current region is the first current region when determined that the total value exceeds the determination value, and
when a predetermined setting parameter is lower than a predetermined threshold, sets the determination value to be greater than that when the setting parameter is higher than the threshold, the setting parameter being at least one of: a voltage applied to a high-potential side terminal of both terminals of each of the plurality of switches and; a temperature of each of the plurality of the switches.

6. The drive circuit according to claim 2, wherein:
the drive control unit
selects, as target switches to be driven to be turned on, at least two switches among the switches in a first current region, and
selects, as the target switches to be driven to be turned on, a fewer number of switches than the number of switches that are selected as the target switches to be driven to be turned on in the first current region, in a second current region that is a current region in which a current is smaller than that in the first current region; and
the drive control unit
determines that a present current region is the second current region when determined that a total value of currents that flow to a parallel-connection body of the switches is equal to or less than a predetermined determination value,
determines that the present current region is the first current region when determined that the total value exceeds the determination value, and
when a predetermined setting parameter is lower than a predetermined threshold, sets the determination value to be greater than that when the setting parameter is higher than the threshold, the setting parameter being at least one of: a voltage applied to a high-potential side terminal of both terminals of each of the plurality of switches and; a temperature of each of the plurality of the switches.

7. The drive circuit according to claim 3, wherein:
the drive control unit
selects, as target switches to be driven to be turned on, at least two switches among the switches in a first current region, and
selects, as the target switches to be driven to be turned on, a fewer number of switches than the number of switches that are selected as the target switches to be driven to be turned on in the first current region, in a second current region that is a current region in which a current is smaller than that in the first current region; and
the drive control unit
determines that a present current region is the second current region when determined that a total value of currents that flow to a parallel-connection body of the switches is equal to or less than a predetermined determination value,
determines that the present current region is the first current region when determined that the total value exceeds the determination value, and
when a predetermined setting parameter is lower than a predetermined threshold, sets the determination value to be greater than that when the setting parameter is higher than the threshold, the setting parameter being at least one of: a voltage applied to a high-potential side terminal of both terminals of each of the plurality of switches and; a temperature of each of the plurality of the switches.

8. The drive circuit according to claim 4, wherein:
the drive control unit
selects, as target switches to be driven to be turned on, at least two switches among the switches in a first current region, and
selects, as the target switches to be driven to be turned on, a fewer number of switches than the number of switches that are selected as the target switches to be driven to be turned on in the first current region, in a second current region that is a current region in which a current is smaller than that in the first current region; and
the drive control unit
determines that a present current region is the second current region when determined that a total value of currents that flow to a parallel-connection body of the switches is equal to or less than a predetermined determination value,
determines that the present current region is the first current region when determined that the total value exceeds the determination value, and when a predetermined setting parameter is lower than a predetermined threshold, sets the determination value to be greater than that when the setting parameter is higher than the threshold, the setting parameter being at least one of: a voltage applied to a high-potential side terminal of both terminals of each of the plurality of switches and; a temperature of each of the plurality of the switches.

* * * * *